(12) United States Patent
Meyer et al.

(10) Patent No.: US 8,741,690 B2
(45) Date of Patent: Jun. 3, 2014

(54) PACKAGED SEMICONDUCTOR DEVICE WITH ENCAPSULANT EMBEDDING SEMICONDUCTOR CHIP THAT INCLUDES CONTACT PADS

(75) Inventors: Thorsten Meyer, Regensburg (DE); Rainer Leuschner, Regensburg (DE); Gerald Ofner, Regensburg (DE); Reinhard Hess, Straubing (DE); Recai Sezi, Roettenbach (DE)

(73) Assignee: Infineon Technologies AG, Neubiberg (DE)

( * ) Notice: Subject to any disclaimer, the term of this patent is extended or adjusted under 35 U.S.C. 154(b) by 212 days.

(21) Appl. No.: 13/453,787

(22) Filed: Apr. 23, 2012

(65) Prior Publication Data

US 2012/0208319 A1    Aug. 16, 2012

Related U.S. Application Data

(62) Division of application No. 12/750,946, filed on Mar. 31, 2010, now Pat. No. 8,183,696.

(51) Int. Cl.
*H01L 21/00* (2006.01)

(52) U.S. Cl.
USPC .................. 438/107; 257/774; 257/E23.011; 257/E21.599

(58) Field of Classification Search
USPC .......... 438/107, 108; 257/774, 778, E23.011, 257/E21.599
See application file for complete search history.

(56) References Cited

U.S. PATENT DOCUMENTS

| | | |
|---|---|---|
| 2001/0010627 A1 | 8/2001 | Akagawa |
| 2004/0178495 A1 | 9/2004 | Yean et al. |
| 2004/0222510 A1 | 11/2004 | Aoyagi |
| 2009/0218678 A1 | 9/2009 | Kawabata et al. |
| 2010/0237492 A1 | 9/2010 | Sasaki et al. |
| 2011/0133682 A1 | 6/2011 | Egger et al. |
| 2011/0204513 A1 | 8/2011 | Meyer et al. |
| 2011/0221069 A1 | 9/2011 | Kunimoto |

FOREIGN PATENT DOCUMENTS

| | | |
|---|---|---|
| DE | 10 2005 043 557 A1 | 9/2006 |
| DE | 11 2006 001 036 T5 | 2/2008 |

*Primary Examiner* — Sonya D McCall Shepard
(74) *Attorney, Agent, or Firm* — Slater & Matsil, L.L.P.

(57) ABSTRACT

A method of manufacturing a semiconductor package includes embedding a semiconductor chip in an encapsulant. First contact pads are formed on a first main face of the semiconductor package and second contact pads are formed on a second main face of the semiconductor package opposite the first main face. A diameter d in micrometers of an exposed contact pad area of the second contact pads satisfies d≥(8/25)x+142 μm, where x is a pitch of the second contact pads in micrometers.

25 Claims, 5 Drawing Sheets

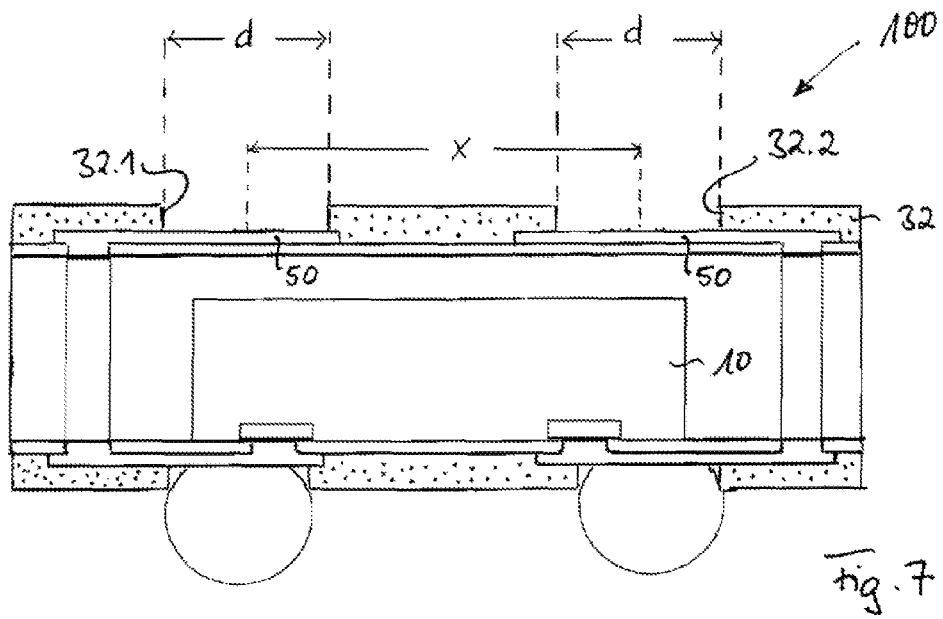
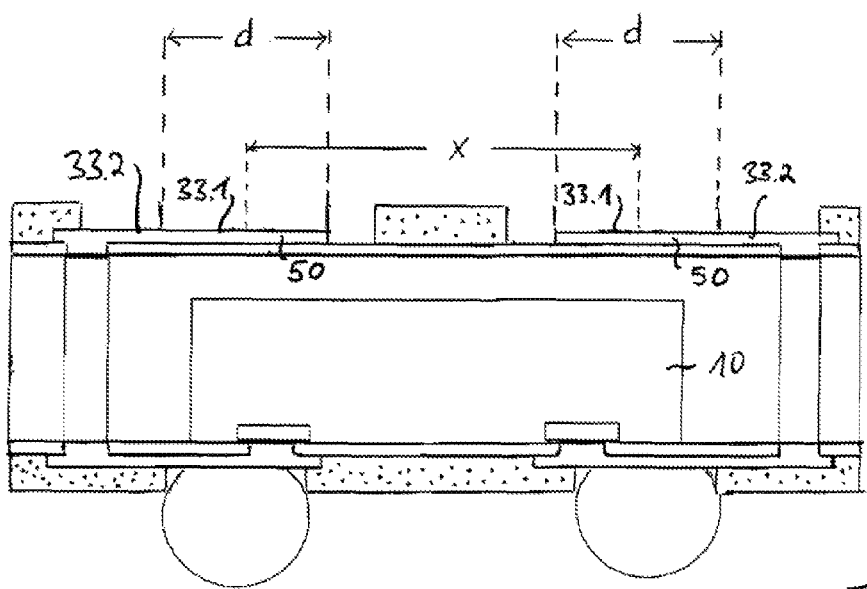

US 8,741,690 B2

PACKAGED SEMICONDUCTOR DEVICE WITH ENCAPSULANT EMBEDDING SEMICONDUCTOR CHIP THAT INCLUDES CONTACT PADS

This is a divisional application of U.S. application Ser. No. 12/750,946, which was filed on Mar. 31, 2010, and is incorporated herein by reference.

TECHNICAL FIELD

The invention relates generally to semiconductor packages, and more particularly to a semiconductor package configured for use in a stacked package device.

BACKGROUND

Market demand for smaller and more functional electronic devices has driven the development of semiconductor devices, including semiconductor packages, and entire systems including multichip packages or stacks of packages. The space available inside the electronic devices is limited, particularly as the electronic devices are made smaller. Stacked packages, especially package-on-package (PoP) techniques are one approach in today's packaging technology to cope with reduced board space.

Both the manufacturers and the consumers of electronic devices desire devices that are reduced in size and yet have increased device functionality.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 7 schematically illustrates one embodiment of a semiconductor package; and

FIG. 8 schematically illustrates one embodiment of a semiconductor package.

DETAILED DESCRIPTION OF ILLUSTRATIVE EMBODIMENTS

Figure 1A:
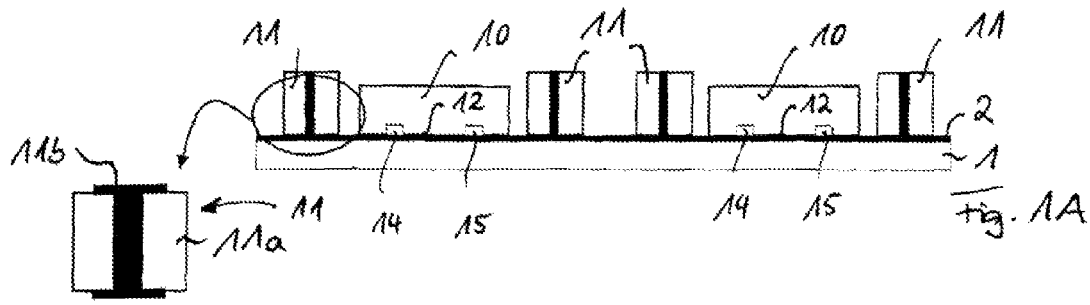
FIGS. 1A to 1F schematically illustrate one exemplary embodiment of a method of manufacturing a semiconductor package.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," "upper," "lower," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Packages and devices with semiconductor chips are described below. The semiconductor chips may be of different types, may be manufactured by different technologies and may include for example, integrated electrical, electro-optical or electro-mechanical circuits and/or passive devices. The semiconductor chips may, for example, be designed as logic integrated circuits, analog integrated circuits, mixed signal integrated circuits, memory circuits or integrated passive devices. They may include control circuits, microprocessors or microelectromechanical components. By way of example, a semiconductor chip may be a baseband chip used in mobile communications devices. Further, they may include power semiconductor devices, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. In particular, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure may have contact elements, in particular, on its two main faces, that is to say on its top side and bottom side. In particular, power semiconductor chips may have a vertical structure. By way of example, the source electrode and gate electrode of a power MOSFET may be situated on one main face, while the drain electrode of the power MOSFET is arranged on the other main face. Furthermore, the devices described below may include integrated circuits to control the integrated circuits of other semiconductor chips, for example, the integrated circuits of power semiconductor chips. The semiconductor chips need not be manufactured from specific semiconductor material, for example, Si, SiC, SiGe, GaAs, AlGaAs and, furthermore, may contain inorganic and/or organic materials that are not semiconductors, such as, for example, insulators, plastics or metals.

The devices described below include external contact pads on the package. The contact pads may represent external terminals of the package. They may be accessible from outside the package and may thus allow electrical contact to be made with the semiconductor chips from outside the package. Furthermore, the (external) contact pads may be thermally conductive and may serve as heat sinks for dissipating the heat generated by the semiconductor chip. The contact pads may be composed of any desired electrically conductive material, for example, of a metal, such as copper, aluminum or gold, a metal alloy or an electrically conductive organic material. Solder material, such as solder balls or solder bumps, may be deposited on the external contact pads.

The semiconductor chips, or at least parts of the semiconductor chips, are covered with an encapsulant which may be electrically insulating. The encapsulant may be a dielectric material and may be made of any appropriate duroplastic, thermoplastic or thermosetting material or laminate (prepreg). The encapsulant may contain filler materials. After its deposition, the encapsulant may be only partially hardened and may be completely hardened after application of energy (e.g., heat, UV light, etc.). Various techniques may be employed to cover the semiconductor chips with the encapsulant, for example, compression molding, injection molding, powder molding, liquid molding, dispensing or laminating.

The encapsulant may be used to produce so-called fan-out type packages. In a fan-out type package, at least some of the external contact pads and/or conductor tracks electrically connecting the semiconductor chip to the external contact pads are located laterally outside of the outline of the semiconductor chip or at least intersect the outline of the semiconductor chip. Thus, in fan-out type packages, a peripherally outer part of the package of the semiconductor chip is typically (additionally) used for electrically bonding the package to external applications, such as, e.g., application boards or, in stacked package applications, other packages. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

Portions of the encapsulant may be removed, for example, in order to create one or more recesses, through-holes or trenches in the encapsulant. Removing the encapsulant may be carried out by using a laser beam or a water jet, mechanical sawing using a saw or a cutter, chemical etching, milling or any other appropriate method. In the recesses, through-holes or trenches, electrically conductive material may be deposited, for example, in order to create one or more through-connections. The through-connections may extend from a first face of the encapsulant to a second face of the encapsulant. The through-connections are electrically conductive and may electrically couple an electrically conductive layer on the first face to an electrically conductive layer on the second face of the encapsulant of the package. The through-connections may, for example, be vias (vertical interconnect access).

The recesses, through-holes or trenches may, for example, be filled with a paste containing metal particles. The metal particles may, for example, be made of silver, gold, copper, tin or nickel. The metal particles may be dispersed in a suitable liquid or solvent. After their application, the metal particles may be heated and thereby sintered. Apart from the recesses, through-holes and trenches, the metal particles may be deposited onto any other surface of the encapsulant.

One or more metal layers may be placed over the encapsulant and/or the semiconductor chip embedded in the encapsulant. The metal layers may, for example, be used to produce a redistribution layer within a conductive redistribution structure. The metal layers may be used as wiring layers to make electrical contact with the semiconductor chips from outside the package and/or to make electrical contact with other semiconductor chips and/or components contained in the package. The metal layers may be manufactured with any desired geometric shape and any desired material composition. The metal layers may, for example, be composed of conductor tracks, but may also be in the form of a layer covering an area. They may be used to provide the contact pads of the package. Any desired metal, for example, aluminum, nickel, palladium, silver, tin, gold or copper, or metal alloys may be used as the material. The metal layers need not be homogenous or manufactured from just one material, that is to say various compositions and concentrations of the materials contained in the metal layers are possible. Thin-film technologies may be applied to generate and/or structure the metal layers. Furthermore, the metal layers may be arranged above or below or between electrically insulating layers forming part of the conductive redistribution structure. An insulating layer overlaying a metal layer may be used as a solder stop of the contact pads.

Figure 3:
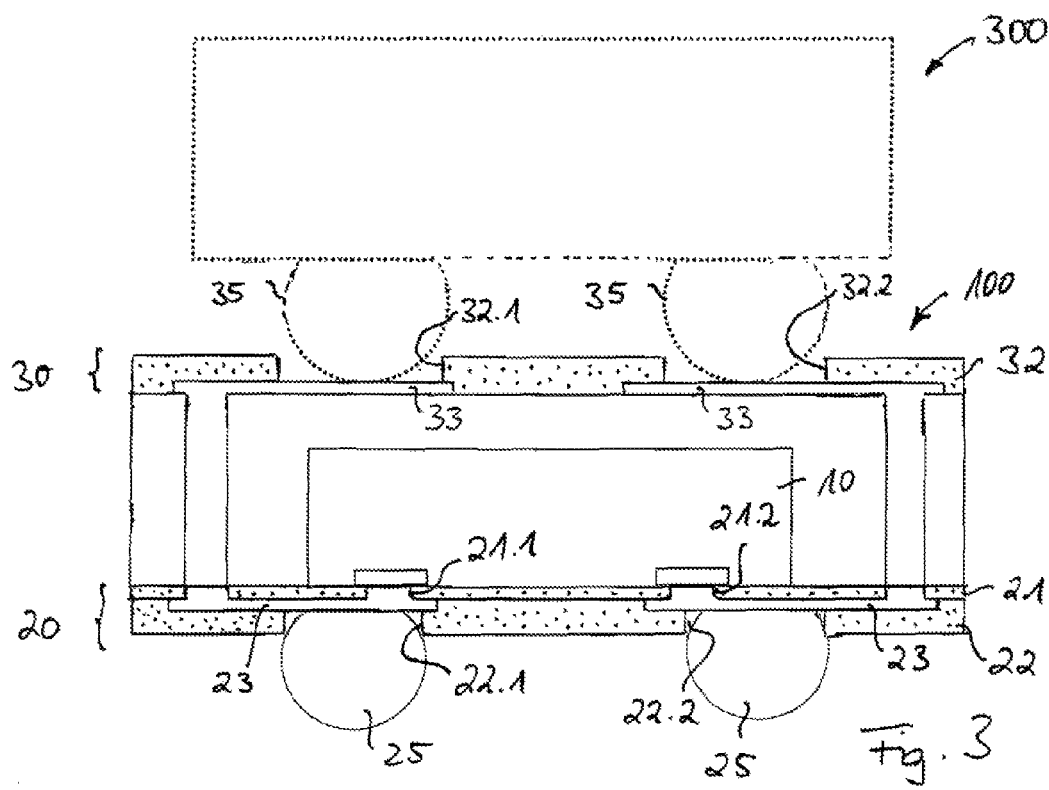
FIG. 3 schematically illustrates one embodiment of a semiconductor package.

FIGS. 1A to 1F schematically illustrate a method of manufacturing a semiconductor package 100 (see also FIG. 3). In a first step (FIG. 1A), a (temporary) carrier 1 is provided. The carrier 1 may be rigid or may be flexible to a certain degree and may be fabricated from materials such as metals, metal alloys, silicon, glass or plastics. An adhesive tape 2 may be laminated on the carrier 1. The adhesive tape 2 may be a double sided sticky tape. Alternatively, a glue material or any other adhesive material or mechanical securing means (such as a clamping device or a vacuum generator) may be associated with the carrier 1.

At least two semiconductor chips 10 are provided and placed on the carrier 1. Further, as shown in FIG. 1A, via bars 11 may be placed on the carrier 1 in spacings between adjacent semiconductor chips 10. The via bars 11 may include an envelope 11a which may be made of an insulating material and at least one conducting element 11b running through the envelope 11a. By way of example, PCB (printed circuit board) via bars 11 may be used. In PCB via bars 11, the insulating material of the envelope 11a may be made of epoxy resin. The semiconductor chips 10 and the via bars 11 are fixed on the carrier 1 by means of the adhesive tape 2 or other appropriate equipment.

The distance between neighboring semiconductor chips 10 may be in the range of between 200 µm and 10 mm. It is to be noted that throughout FIGS. 1A to 1F, only a partial section of a semiconductor chip array or "artificial wafer" is illustrated, that is to say in practice, typically many more than two semiconductor chips 10 are placed on the carrier 1.

Semiconductor chips 10 may have contact elements 14, 15 on a lower main chip surface 12 facing the carrier 1. If the semiconductor chip 10 is a logic integrated circuit, typically several tens of contact elements 14, 15 are arranged on the lower main chip surface 12. The lower main chip surface 12 typically forms the active surface of the semiconductor chip 10. If the semiconductor chips 10 are power transistors, the contact element 14 may, e.g., be a source terminal and the contact element 15 may, e.g., be a gate terminal.

Figure 1B:
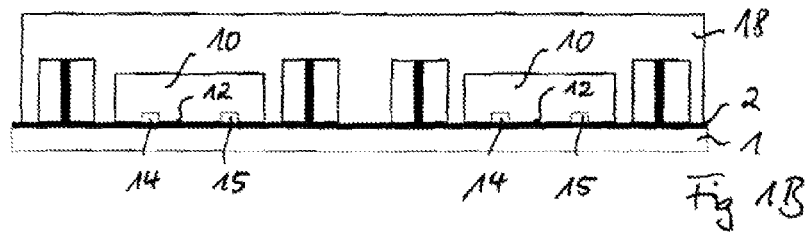

An electrically insulating molding material or encapsulant 18 is applied to the semiconductor chips 10 and the carrier 1, see FIG. 1B. The encapsulant 18 may be used to encapsulate the semiconductor chips 10 except their lower main chip surfaces 12 containing the contact elements 14, 15. The encapsulant 18 may be an epoxy or another appropriate material used in contemporary semiconductor packaging technology. It may also be a photoresist such as SU8, which is epoxy-based. The encapsulant 18 may be composed of any appropriate thermoplastic or thermosetting material. After curing, the encapsulant 18 provides stability to the array of semiconductor chips 10 and via bars 11. Various techniques may be employed to cover the semiconductor chips 10 and via bars 11 with the encapsulant 18, for example, compression molding or injection molding.

By way of example, in a compression molding process the liquid encapsulant 18 is dispensed into an open lower mold half of which the carrier 1 forms the bottom. Then, after dispensing the liquid encapsulant 18, an upper mold half is moved down and spreads out the liquid encapsulant 18 until a cavity between the carrier 1 forming the bottom of the lower mold half and the upper mold half is completely filled. This process may be accompanied by the application of heat and pressure. After curing, the encapsulant 18 is rigid and forms a molded body. The larger the lateral size of the molded body ("molded reconstituted wafer") and the number of embedded chips 10, the more cost efficient the process will typically be.

As may be seen from FIG. 1B, the semiconductor chips 10 may be completely overmolded, i.e., completely covered by encapsulant 18.

In a subsequent step, the encapsulant 18 is released from the carrier 1. To this end, the adhesive tape 2 may feature thermo-release properties, which allow the removal of the adhesive tape 2 during a heat treatment. The removal of the adhesive tape 2 from the encapsulant 18 including the semiconductor chips 10 and via bars 11 is carried out at an appropriate temperature which depends on the thermo-release properties of the adhesive tape 2 and is usually higher than 150° C., in particular, approximately 200° C. The encapsulant 18 is also referred to as an "artificial wafer" or "reconstituted wafer" in the art. The encapsulant 18 may, e.g., be disc-shaped having a diameter of, e.g., 200 or 300 mm, or may have any other shape such as a polygonal shape and the same or other lateral dimensions.

Figure 1C:
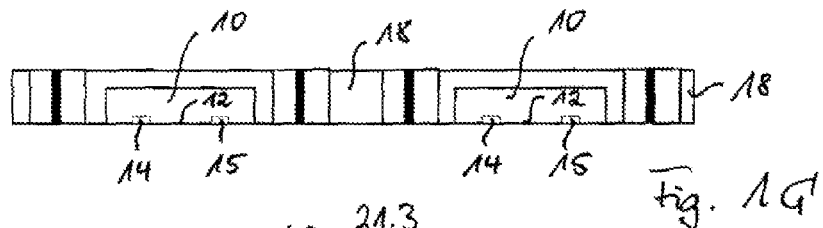

Further to FIG. 1C, the molded body is thinned (FIG. 1C). Thinning is usually performed after the release of the encapsulant 18 from the carrier 1. Grinding or lapping machines may be used that are similar or identical to the machines used for semiconductor wafer grinding or lapping in frontend technology. Alternatively, etching may be used to reduce the thickness of the encapsulant 18. Thinning of the encapsulant 18 may be continued at least until the upper main surface of the via bars 11 is exposed.

By way of example, the encapsulant 18 in FIG. 1B may have a thickness of about a couple of hundred micrometers, e.g., more than 300 µm, 500 µm, 800 µm or even more than 1000 µm. The thickness of the encapsulant 18 in FIG. 1B is greater than the thickness of the semiconductor chips 10. As semiconductor wafers are often fabricated with a thickness of about 500 µm or 1000 µm, and may be ground in frontend processes to be as small as about 200 µm or even less, the thickness of the semiconductor chip 10 may be, e.g., in a range of about 100 µm to 1000 µm. As an specific example, the encapsulant 18 in FIG. 1B may have a thickness of about 800 µm, the semiconductor chips 10 may have a thickness of about 250 µm and the via bars 11 may have a thickness of about 300 µm. After thinning (FIG. 1C), the thickness of the encapsulant 18 may be reduced to about 280 µm, and the upper surface of the encapsulant 18 may be planar.

Figure 1D:
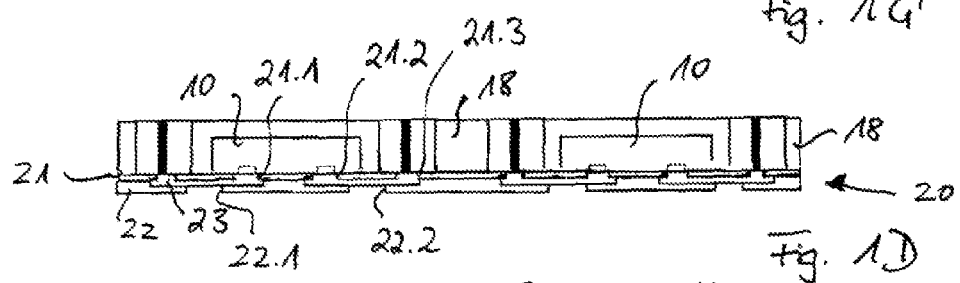
Figure 1E:
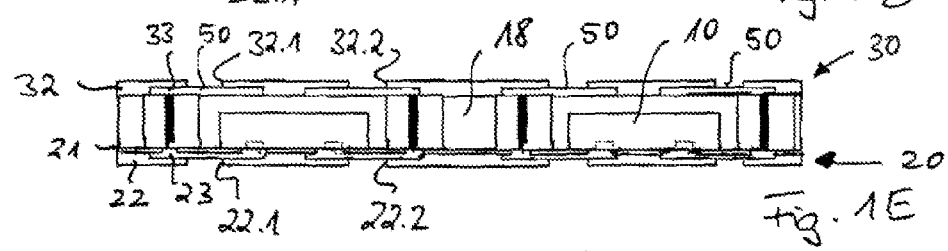
Figure 1F:
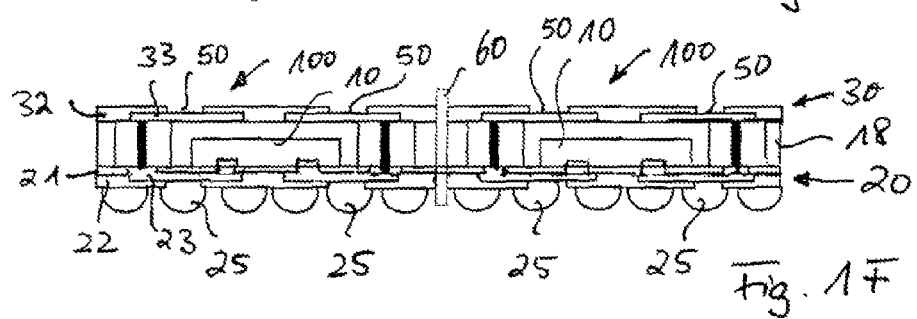

FIGS. 1D to 1F illustrate method steps to produce conductive redistribution structures 20, 30 on both main faces of the encapsulant 18. First, the conductive redistribution structure 20 on the lower main face of the encapsulant 18 and the lower main surface 12 of the semiconductor chip 10 may be generated. These surfaces may be arranged flush with each other, that is the conductive redistribution structure 20 may be generated on a planar surface. The conductive redistribution structure 20 may include a first polymer layer 21, a second polymer layer 22 and a metal layer 23 arranged between the first polymer layer 21 and the second polymer layer 22, see also FIG. 3.

The first polymer layer 21 may be deposited to cover the lower main face of the encapsulant 18 and the lower main faces 12 of the semiconductor chips 10. The thickness of the first polymer layer 21 may be between 2 and 10 µm, typically about 5 µm. A standard CVD (Chemical Vapor Deposition) process or spin coating process may be used. The first polymer layer 21 may be made of a photoresist or of any other etching resist.

The first polymer layer 21 is structured. Structuring may be accomplished by photolithographic techniques known in the art. During structuring, through-holes 21.1, 21.2 and 21.3 are generated in the first polymer layer 21. At the bottom of through-holes 21.1 and 21.2, the chip contact elements 14, 15 are exposed. At the bottom of through-hole 21.3, the conductive element 11b of the via bar 11 is exposed.

In a next step, the metal layer 23 is applied onto the first polymer layer 21 and structured. In through-holes 21.1, 21.2 and 21.3, the metal layer 23 makes contact to the chip contact elements 14, 15 and the conductive element 11b, respectively.

Many techniques are available to generate the structured metal layer 23, inter alia galvanic deposition, electroless deposition, printing etc.

The second polymer layer 22 is deposited over the metal layer 23. The second polymer layer 22 may be made of the same material as the first polymer layer 21 and the thickness of the second polymer layer 22 may be in the same range as the thickness of the first polymer layer 21.

The second polymer layer 22 is then structured by, e.g., photolithographic techniques to provide for openings 22.1, 22.2. The external contact members 25, e.g., solder balls, are then applied (e.g., so-called solder ball attach). Through the openings 22.1, 22.2, contact is made between external contact members 25 (e.g., solder balls) and the metal layer 23. The metal layer 23 connecting the contact elements 14, 15 of the semiconductor chips 10 to the external contact members 25 of the semiconductor package 100 is often referred to as a redistribution layer in the art.

The conductive redistribution structure 30 on the upper main face of the encapsulant 18 may be generated the same way as the conductive redistribution structure 20. Similar to the lower main face 12, the upper main face of the encapsulant 18 may be planar. The conductive redistribution structure 30 may include a metal layer 33 (corresponding to the metal layer 23) and a polymer layer 32 (corresponding to the second polymer layer 22) overlying the metal layer 33. The metal layer 33 may be made of the same materials as and structured similar to the metal layer 23. The metal layer 33 includes structures which are electrically connected (e.g., through via bars 11) to contact elements 14, 15 of the semiconductor chip 10 and may form contact pads 50 of the semiconductor package 100. The polymer layer 32 includes openings 32.1, 32.2 through which the contact pads 50 may be electrically connected to external contact members (e.g., solder balls) 35 of another semiconductor package 300 to be mounted on semiconductor package 100 as shown in FIG. 3. The polymer layer 32 may optionally form a solder stop layer which may be effective in a reflow process when mounting the semiconductor package 300 on semiconductor package 100.

It is to be noted that the method steps used to generate the conductive redistribution structures 20, 30 may be thin-film processing steps using techniques such as CVD, spin coating, galvanic plating, electroless plating, printing, photolithography etc. These steps form part of the so-called backend fabrication process, i.e., are fabrication steps which are applied after the integrated circuits of the semiconductor chips 10 have been finished and tested on wafer level (so-called frontend processing). It is to be noted that the backend processing steps illustrated in FIGS. 1D and 1E may still be performed on an artificial wafer level, i.e., before the separation of the artificial wafer into single semiconductor packages 100.

The separation of the artificial wafer into single semiconductor packages 100 may be performed along dicing lines or dicing streets 60. Each semiconductor package 100 may contain one or more semiconductor chips 10. By way of example, separation may be performed by mechanical dicing (e.g., blade sawing, cutting, water-jet separation), chemical dicing (e.g., etching) or laser dicing.

FIGS. 2A to 2E schematically illustrate one embodiment of a method of manufacturing a semiconductor package 200. In a first step, semiconductor chips 10 are placed and fixed on a carrier 1 and are overmolded by an encapsulant 18. Optionally, the encapsulant 18 may then be thinned. In order to avoid reiteration, reference is made to the description of FIGS. 1A to 1C. The method steps used for generating the overmolded array of semiconductor chips 10 shown in FIG. 2A may only distinguish from the method steps shown in FIGS. 1A to 1C in that no via bars 11 are used.

Figure 2A:
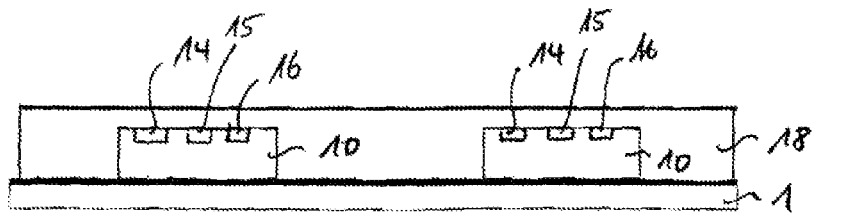
FIGS. 2A to 2E schematically illustrate one exemplary embodiment of a method of manufacturing a semiconductor package.
Figure 2B:
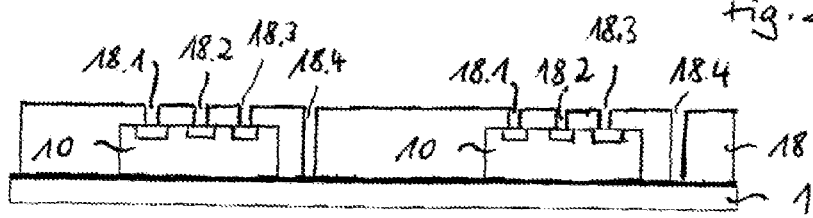

The dielectric material of the encapsulant 18 may be structured as illustrated in FIG. 2B. A plurality of recesses 18.1, 18.2, 18.3 (or cutouts or through-holes or trenches) are created in the dielectric material of the encapsulant 18 to expose at least portions of contact elements 14, 15, 16 of the semiconductor chip 10. The contact elements 14, 15, 16 are contact pads of the semiconductor chip 10 and may be located at the upper main surface of the semiconductor chip 10. Further, a recess 18.4 (or cutout or through-hole or trench) may be created in a region outside of the outline of the semiconductor chip 10 and may extend through the encapsulant 18 from one main face to the other main face thereof. Removing the encapsulant 18 may be carried out by using a laser beam or a water jet, mechanical sawing using a saw or a cutter, chemical etching, milling or any other appropriate method. If the encapsulant 18 includes photo-active components, the encapsulant 18 may also be photo-lithographically structured. The widths of the recesses 18.1, 18.2, 18.3 and 18.4 may, for example, be in the range from 10 to 200 μm.

After structuring the dielectric material of the encapsulant 18, a conductive layer 40 is applied to the upper main face of the encapsulant 18. The conductive layer 40 may consist of a seed layer (not illustrated) and a further layer which is galvanically deposited onto the seed layer. The seed layer may consist of a barrier layer and a starting layer for the electroplating. An electroless deposition method may be used to produce the seed layer as well. The seed layer may have a thickness of up to 1 μm and may, for example, be made of titanium, titanium containing alloy or chrome as barrier layer and, for example, copper as starting layer. The electrical conductivity of the seed layer may be used to galvanically deposit an electrically conductive layer, for example, a copper layer, on the seed layer. The copper layer may have virtually any desired thickness depending on the application and current requirements. By way of example, the thickness of the copper layer may be in a range between 2 μm and 15 μm. As an alternative to the galvanic plating process describe above, an electroless plating process such as electroless nickel-palladium plating may be used.

Figure 2C:
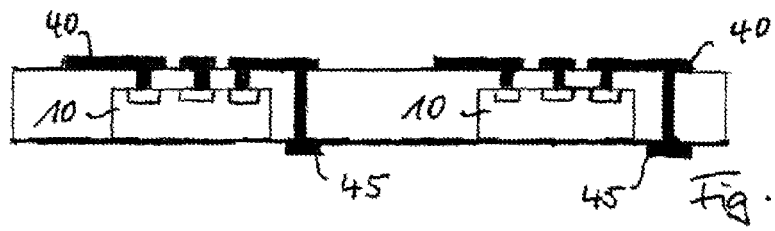
Figure 2D:
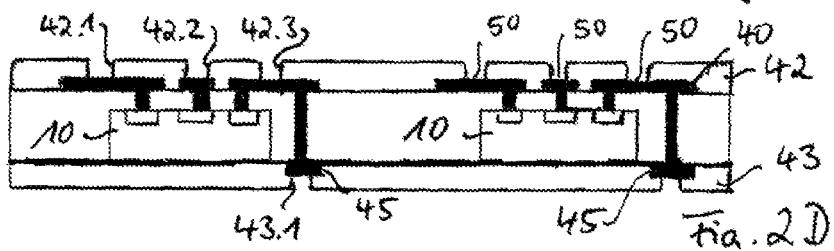

The conductive layer 40 may also be created by depositing a paste containing fine metal particles in the recesses 18.1, 18.2, 18.3, 18.4 and on the planar upper surface of the encapsulant 18, possibly after application of a seed layer. The seed layer allows a low resistance interconnection to the aluminum of the contact pads of the chip. The metal particles may, for example, be made of copper, silver, gold, tin or nickel or a metal alloy. The metal particles may be dispersed in a suitable liquid or solvent. The application of the paste containing the metal particles dispersed in the liquid may be performed by stencil printing, screen printing, ink-jet printing or other suitable printing technologies. As illustrated in FIG. 2C, the conductive layer 40 is a patterned layer, wherein patterning may be performed during deposition of the paste. After the application of the paste, the paste may be exposed to an energy (e.g., elevated temperature, etc.). If elevated temperature is used, it may be in the range from 100 to 300° C. and in particular in the range from 100 to 200° C. This temperature step causes the liquid in the paste to evaporate. Furthermore, the applied temperature may be lower than the melting temperature of the metal (when provided in macroscopic dimensions) of which the metal particles are made. Due to the temperature step, the metal particles may sinter and may thus form a solid metal conductive layer 40. If a seed layer was applied prior to application of the metal particles it is removed by suitable process steps, using the possibly sintered metal particles as a mask for the seed layer.

Before or after the steps shown in FIGS. 2B and 2C, the encapsulant 18 is released from the carrier 1. As illustrated in FIG. 2C, a bottom conductive layer 45 may be optionally applied to the planar lower surface of the encapsulant 18. The bottom conductive layer 45 may electrically connect, e.g., through a conducting material filling recess 18.4 to a contact element 16 of the semiconductor chip 10 at the upper surface thereof. The bottom conductive layer 45 may be applied and structured by the same processes and may consist of the same materials as the upper conductive layer 40.

Similar to metal layer 33, the conductive layer 40 includes structures which are electrically connected to contact elements 14, 15 or 16 of the semiconductor chip 10 and may form contact pads 50 of the semiconductor package 200. A polymer layer 42 may be applied over the structured conductive layer 40, see FIG. 2D. The polymer layer 42 includes openings 42.1, 42.2, 42.3 through which the contact pads 50 may be electrically connected to external contact members (e.g., solder balls) of another semiconductor package (e.g., semiconductor package 300 shown in FIG. 3) to be mounted on semiconductor package 200. The polymer layer 42 may be applied similar to polymer layer 32 by thin-film technology processes and may (optionally) likewise form a solder stop layer as described above with reference to polymer layer 32. As to polymer layer 42, the description relating to polymer layer 32 is applicable and is referred to in order to avoid reiteration. Further, a polymer layer 43 may be applied over the structured bottom conductive layer 45. The polymer layer 43 may be applied and structured by the same processes and may consist of the same materials as the polymer layer 42. The polymer layer 43 includes openings 43.1, . . . through which package terminals formed by the bottom conductive layer 40 and defined by the openings 43.1, . . . may be electrically connected to external contact members (e.g., solder balls on a board).

Figure 2E:
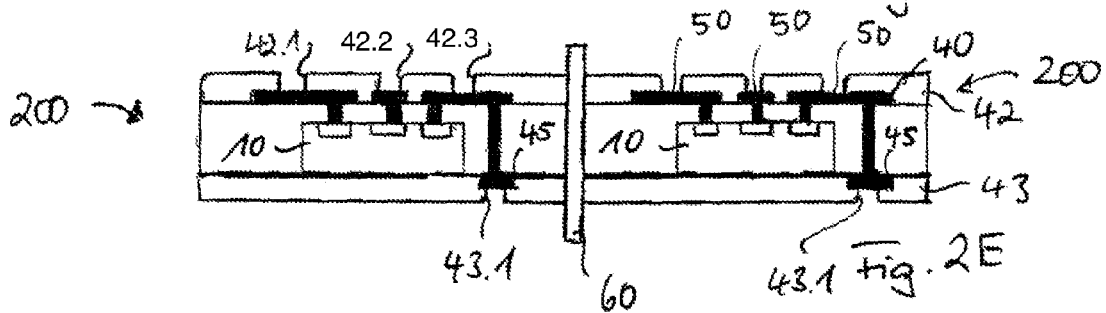

The encapsulant 18 is then separated along dicing line 60 to obtain single semiconductor packages 200 (FIG. 2E). In this context, for the sake of brevity, reference is made to the description of FIG. 1F.

It is to be noted that packages 100, 200 are fan-out type packages. Contact pads 50 of fan-out type packages are located at least partially outside of the lateral contour line of the semiconductor chip 10. In another embodiment (not shown), packages 100, 200 could be fabricated as fan-in type packages, in which the contact pads 50 are located inside the lateral contour line of the semiconductor chip 10.

The semiconductor packages 100, 200, or any other semiconductor packages having contact pads 50 on the upper semiconductor package surface, may be used for establishing package-on-package (PoP) devices. PoP devices typically include two or more packages, which are stacked one on top of the other. Packages 100, 200 may be used as the lowermost or bottom package.

PoP devices may be manufactured by the following process steps. First, the bottom semiconductor package 100, 200 is placed into pre-applied solder paste on a mounting platform, e.g., a board (not shown in FIG. 3). Flux is applied to the contact members (e.g., solder balls) 35 of the upper or top semiconductor package 300, and the top semiconductor package 300 is then placed on the bottom semiconductor package 100, 200 such that the contact members 35 of the top semiconductor package 300 are aligned to contact pads 50 formed on the upper main face of the bottom semiconductor package 100, 200. During a reflow process, this package stack is then subjected to a temperature which is high enough to liquefy both contact members 25 and 35. The bottom semiconductor package 100, 200 is mounted on the mounting platform such as, e.g., a PCB by reflow soldering. Simultaneously, the top semiconductor package 300 is mounted to the bottom semiconductor package 100, 200 by reflow soldering. The assembly of PoP devices is referred to as second level assembly in the art. It is often, but not necessarily, performed by a customer of the manufacturer of the bottom semiconductor package 100, 200.

The top semiconductor package 300 may be of various types and/or designs. It may include another semiconductor chip (not shown) and an encapsulant embedding this top package semiconductor chip. Further, it may include top package contact pads (not shown) on a lower main face of the top semiconductor package 300, wherein the contact members 35 of the top semiconductor package 300 are attached to these top package contact pads.

It is to be noted that when being placed on the bottom semiconductor package 100, 200, typically not all of the contact members 35 of the top semiconductor package 300 will be in touch with the respective contact pad 50 beneath before the beginning of the reflow process. This is due to inevitable warpage of the bottom semiconductor package 100, 200, the top semiconductor package 300 or different sizes of the contact members 35 (that is, e.g., variations in ball diameter). However, since those contact members (e.g., solder balls) 35 which are in touch with their respective contact pads 50 will collapse during the reflow operation, the top semiconductor package 300 will lower down by a certain extent during the reflow operation, causing all contact members 35 to get in touch with their respective contact pads 50 beneath to establish secure electrical contact in each case.

Figure 4:
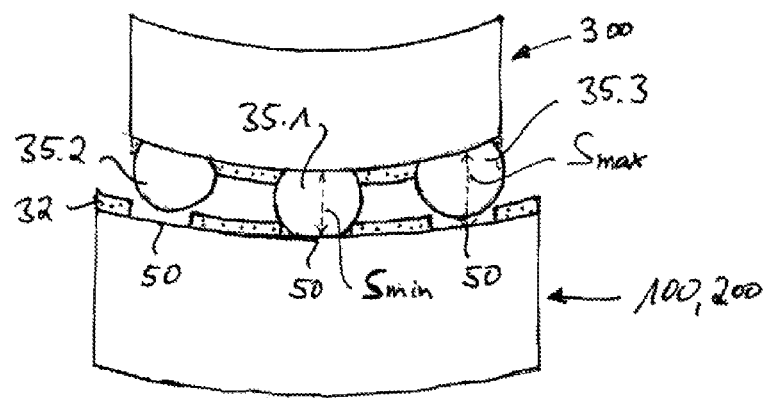
FIG. 4 schematically illustrates a package-on-package device showing warpage and contact failure.

Substantial warpage of the bottom and/or top semiconductor package 100, 200, 300 during reflow, however, may inhibit secure electrical contact between all of the contact members 35 of the top semiconductor package 300 and the respective contact pads 50 of the bottom semiconductor package 100, 200. FIG. 4 illustrates a situation in which the bottom semiconductor package 100, 200 and the top semiconductor package 300 show warpage of the same type, that is warpage in the same direction, whereby, however, the warpage of the top semiconductor package 300 is greater than the warpage of the bottom semiconductor package 100, 200. As a result, as the lower main face of the top semiconductor package 300 is more curved than the upper main face of the bottom semiconductor package 100, 200, the gap between the two semiconductor packages 100, 200, 300 has a greater spacing at edge regions of the semiconductor packages 100, 300, 200 than at a central region of the semiconductor packages 100, 300, 200. As a result, prior to the reflow operation, only the central contact member 35.1 (in practice, typically a number of central contact members 35 which, however, are represented in FIG. 4 by one central contact member 35.1 for the sake of simplification) is in touch with the respective central contact pad 50 of the bottom semiconductor package 100, 200. After the reflow operation, as illustrated in FIG. 4, although this contact member 35.1 has been collapsed to a spacing $S_{min}$, the spacing $S_{max}$ at an edge region of the semiconductor packages 100, 300, 200 may still remain so large that the contact members 35.2, 35.3 at the edge region will not make contact to the respective contact pads 50 on the bottom semiconductor package 100, 200 during the reflow operation. As a result, a faulty PoP device is assembled.

Similarly, contact failure may also occur if the bottom semiconductor package 100, 200 and the top semiconductor package 300 show warpage of different type (e.g. the top semiconductor package 300 shows warpage in the other direction than the bottom semiconductor package 100, 200). In this case, the outermost contact members 35.2, 35.3 may provide secure electrical contact with the respective contact pads 50 whilst the central contact member(s) 35.1 will not get in touch with the respective contact pad(s) 50 during the reflow process and will thus not establish electrical contact(s).

It is to be noted that in practice, the type and degree of warpage of the top semiconductor package 300 is typically unknown to the manufacturer of the bottom semiconductor package 100, 200. By way of example, the top semiconductor package 300 may be a memory package, i.e., a semiconductor package embedding an integrated memory circuit such as, e.g., a RAM (random access memory). Although the functionality of this integrated memory circuit is well-known to the manufacturer of the bottom semiconductor package 100, 200, and also some of the package specifications (e.g., the positions of the contact members 35) of the top semiconductor package 300 are predetermined by the design of the bottom semiconductor package 100, 200 and are thus known to the manufacturer of the bottom semiconductor package 100, 200, the package type and/or the particular package design of the top semiconductor package 300 is typically unknown to the manufacturer of the bottom semiconductor package 100, 200. By way of example, the top semiconductor package 300 may, e.g., be designed as a flip-chip BGA (Ball Grid Array), a BoC (Board on Chip) wirebonded type package or a WLP (Wafer Level Packaging) fan-in or fan-out type package. These and other types and designs of packages exhibit quite different warpage behavior during reflow soldering, but may all be available as top semiconductor packages 300 for assembling PoP devices. That is, the manufacturer of the bottom semiconductor package 100, 200 often has no influence on or knowledge of which type or design of top semiconductor package 300 will be used (e.g., by a customer or even by the manufacturer itself for future second level assembly). In other words, the manufacturer of the bottom semiconductor package 100, 200 often may not predict the type and degree of warpage of the top semiconductor package 300 to be used and thus the variation of the spacing S between the stacked semiconductor packages 100, 200 and 300.

Figure 5:
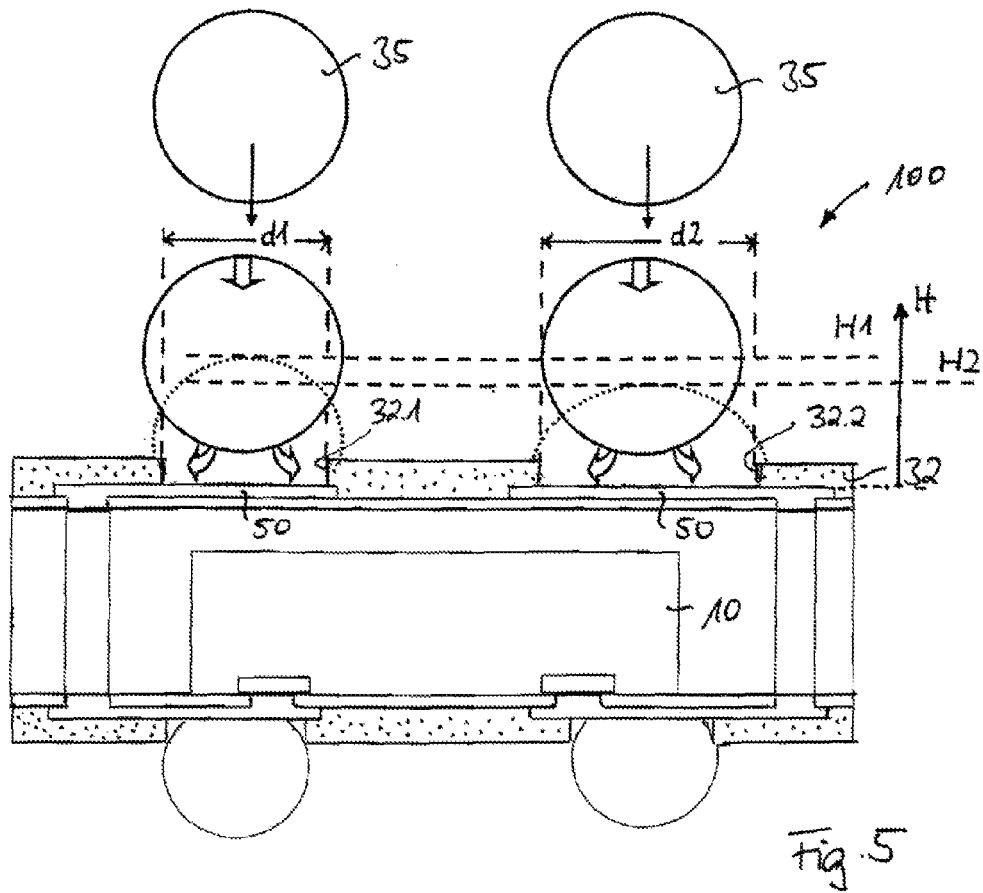
FIG. 5 schematically illustrates a semiconductor package having a first contact pad area of conventional diameter and a second contact pad area of enlarged diameter.

According to one aspect, the geometry of the spacing S between the bottom semiconductor package 100, 200 and the top semiconductor package 300 is influenced by the size of the exposed contact pad area of the contact pads 50 at the upper main face of the bottom semiconductor package 100, 200. FIG. 5 illustrates the relationship between the exposed area of a contact pad 50 and the collapsing height H (over contact pad 50) of a solder ball 35 attached to the contact pad 50. The exposed contact pad areas are given by the diameters d1, d2 of the openings 32.1, 32.2 of the polymer layer 32, respectively. The larger the diameter d of the exposed contact pad area, the larger is the area which can be wetted by the liquid solder during reflow, and the lower is then the height of the collapsed contact member 35, provided identical solder ball volumes are used. In other words, by increasing the diameter d of the exposed contact pad area, the spacing S between the bottom and top semiconductor packages 100, 200, 300 may be decreased. In other words, the top semiconductor package 300 will be brought down nearer to the bottom semiconductor package 100, 200 when the diameter d of the exposed contact pad area is increased, that is H2<H1 if d2>d1. By way of example, it has been found that an increase in diameter d from, e.g., d1=240 μm to d2=260 μm may yield a decrease in the spacing S of about 8 μm, that is H1−H2≈8 μm.

As stipulated in JEDEC, the Global Standards for the Microelectronics Industry, specific package specifications should be met by bottom semiconductor packages 100, 200 of PoP devices. In the following, the exposed contact pad area is also referred to as a "landing pad." Typical landing pad diameters d as of today are set out in Table 1.

TABLE 1

| Pad pitch | Typical ball diameter | Typical landing pad diameter d as of today |
|---|---|---|
| 400 μm | 250 μm | 240 μm |
| 500 μm | 300 μm | 280 μm |
| 650 μm | 350 μm | 320 μm |
| ... | | |

According to one aspect, the diameter d in micrometer of an exposed contact pad area of the contact pads 50 on the upper main face of the bottom semiconductor package 100, 200 is designed to satisfy the relationship $$d \geq (8/25)x + 142 \; \mu m, \quad (1)$$

wherein x is the pitch of the contact pads 50 in micrometer (see also the illustration of x in FIGS. 7 and 8). Pitch x is also referred to as "ball pitch" in the art.

According to relationship (1), the diameter d of the exposed contact pad area is significantly larger than the diameter d set out in Table 1 and recommended in the JEDEC standard. As a result of the increase of the diameter d of the exposed contact pad area, the collapsing height H of the contact members 35 is lowered during the reflow operation. More specifically, the difference between the two collapsed heights H1 (when using today's small diameter d1) and H2 (when using enhanced diameter d2 according to relationship (1)) is the additional tolerance in warpage and contact member height (e.g., solder ball height), which can be compensated during second level assembly of the top semiconductor package 300.

Figure 6:
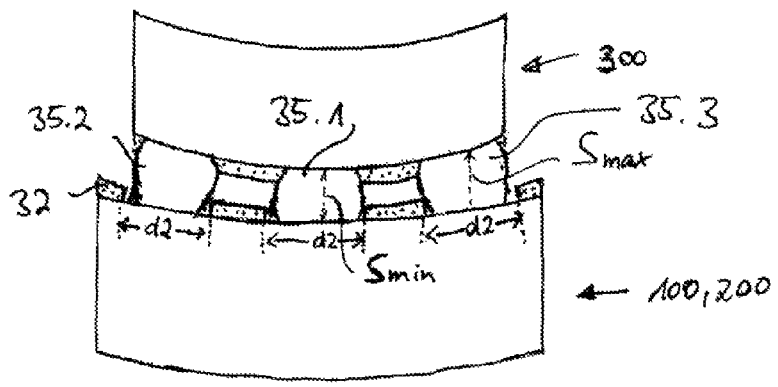
FIG. 6 schematically illustrates a package-on-package device showing warpage without contact failure.

The effect is illustrated in FIG. 6. In FIG. 6 the warpage of the bottom semiconductor package 100, 200 and the top semiconductor package 300 is identical to the warpage of these packages in FIG. 4. The diameter of the openings 32.1, 32.2 of the polymer layer 32 has been increased from d1 to d2. As a result, the minimum spacing $S_{min}$ between the semiconductor packages 100, 200, 300 is reduced by H1-H2. The maximum spacing $S_{max}$ is reduced by the same quantity H1-H2. As a consequence, the outermost contact members 35.2, 35.3 may come into contact with the respective contact pads 50 during the solder reflow operation. Therefore, as shown in FIG. 6, secure electrical contacts are established between all contact members 35.1, 35.2 and 35.3 and the respective contact pads 50, in particular, also at the edge regions of the stacked PoP device. The interconnect yield during second level assembly is significantly improved, because larger warpage may be compensated.

The PoP device may have a spacing S between the lower main face of the top semiconductor package 300 and the upper main face of the bottom semiconductor package 100, 200 that varies by more than 8 μm, in particular, 10 μm, more in particular, 12 μm across the lateral extension of the spacing S. Generally, warpage of the upper main face of the bottom semiconductor package 100, 200 and warpage of the lower main face of the top semiconductor package 300 may both contribute to the variation in spacing S of the PoP device. More specifically, the lower main face of the top semiconductor package 300 may, e.g., have a warpage height of at least 8 μm, in particular, 10 μm, more in particular, 12 μm across the lateral extension of the lower main face. Further, the upper main face of the bottom semiconductor package 100, 200 may, e.g., have a warpage height of at least 8 μm, in particular, 10 μm, more in particular, 12 μm across the lateral extension of the upper main face.

This concept of increasing the diameter of the exposed contact pad areas 50 on the upper main face of the bottom semiconductor package 100, 200 is likewise applicable for any type of warpage behavior. By way of example, if the top semiconductor package 300 exhibits a warpage in the reverse direction as shown in FIGS. 4 and 6, the outermost contact members 35.2 and 35.3 are those contact members 35 which are initially in touch with the respective contact pads 50 beneath, and will collapse down during reflow to a smaller height compared to the situation when a standard diameter of the exposed contact pad areas is used, resulting in that the contact member(s) 35.1 in the central region of the semiconductor package stack will then come in touch with the respective contact pad(s) 50 beneath and will thus provide secure electrical and mechanical contact therewith.

As known in the art, the TCoB (Temperature Cycling on Board) reliability of interconnect members (e.g., solder balls) will usually significantly impair on the reduction in height of these members. The reduction in TCoB reliability of interconnect members is caused by an increase of shear stress, which occurs when the height of the interconnect members between two bonded systems of a given difference of CTEs (Coefficient of Thermal Expansion) is reduced. As a matter of fact, the constraint of sufficient TCoB reliability typically severely limits the possibility of decreasing the height of interconnect members between bonded systems. However, regarding second level assembly of PoP devices, the difference between the CTEs of two semiconductor packages is typically small, even for semiconductor packages of different type or design (e.g., BGA, eWLB, BoC). Therefore, when reducing the spacing S between the bottom and top packages 100, 200, 300 and thus the height of the (collapsed) contact members 35, the TCoB-reliability is expected not to be significantly reduced compared to conventional PoP devices using standard landing pad areas as set out in Table 1.

FIG. 7 illustrates a sectional view of a bottom semiconductor package 100 in which the diameter d of the exposed contact pad area is defined by the diameter of the openings 32.1, 32.2 of the polymer layer (solder stop layer) 32. This type of contact pad 50 is also referred to as solder mask defined contact pad.

A non-solder mask defined contact pad 50 is shown in FIG. 8. Here, the diameter d of the exposed area of the contact pad 50 is defined by the lateral dimensions of the metal layer 33 forming the contact pad, that is by the shape of the metal layer 33 itself. By way of example, the metal layer 33 may exhibit a circular region 33.1 of diameter d, which is connected to a conductor trace 33.2 of significantly smaller width than d. The circular region 33.1 of the metal layer 33 then defines the exposed area of the non-solder mask defined contact pad 50. Throughout the specification and claims, the term "exposed contact pad area" and derivations thereof may relate both to a solder mask defined contact pad and a non-solder mask defined contact pad.

In all embodiments, the exposed contact pad area must not be of circular shape but may be of any other suitable geometry, e.g., rectangular, polygonal etc. In this case, the meaning of d as used herein is to identify an exposed contact pad area of size $(\pi/4)d^2$, i.e. a contact pad having the same exposed area as a circular exposed contact pad area of diameter d. As can be seen in FIG. 8, in non-solder mask defined contact pads 50 the polymer layer 32 does not overly the metal layer 33 at the circular region 33.1, and thus does not define the size of the exposed contact pad area 50. Especially if non-solder mask defined contact pads 50 are used (on the upper surface of the bottom semiconductor package 100, 200 or on the lower surface of the top semiconductor package 300), TCoB-reliability may not be reduced compared to the standard approach. The interconnect yield is then improved without any decrease in the TCoB-reliability.

Possible diameters d of the exposed contact pad area are given in Table 2. It is to be noted that the diameters d set out in Table 2 always satisfy the relationship (1). More stringent conditions, which could even compensate for larger warpage of the semiconductor packages 100, 200, 300, are given by:

$$d \geq (8/25)x + 152 \, \mu m, \quad (2)$$

or $$d \geq (8/25)x + 162 \, \mu m. \quad (3)$$

Optionally, an upper limit of diameter d could be expressed by:

$$d \leq (8/25)x + 172 \, \mu m. \quad (4)$$

It is further noted that the relationships (1) to (4) may also apply for pitches x in between of the exemplary pitches of 400 µm, 500 µm, 650 µm set out in Table 2, and for pitches x smaller than 400 µm or larger than 650 µm.

TABLE 2

| Pad pitch | Typical ball diameter | Pad diameter d of exposed pad area (landing pad diameter) |
|---|---|---|
| 400 µm | 250 µm | 260-300 µm |
| 500 µm | 300 µm | 300-340 µm |
| 650 µm | 350 µm | 340-380 µm |
| ... | | |

By way of example, if the pitch is x=400 µm, the diameter d may satisfy d≥260 µm, in particular, d≥280 µm. If the pitch is x=500 µm, the diameter d may satisfy d≥300 µm, in particular, d≥320 µm. If the pitch is x=650 µm, the diameter d may satisfy d≥340 µm, in particular, d≥360 µm.

In all embodiments, the solder material of the contact members 25, 35 may, for example, be composed from at least one of the following materials: SnPb, SnAg, SnAgCu, SnAgCuNi, SnAu, SnCu and SnBi.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor package, the method comprising:
    embedding a semiconductor chip in an encapsulant;
    forming first contact pads on a first main face of the semiconductor package; and
    forming second contact pads on a second main face of the semiconductor package opposite the first main face, wherein a diameter d in micrometers of an exposed contact pad area of the second contact pads satisfies d≥(8/25)x+142 µm, wherein x is a pitch of the second contact pads in micrometers.

2. The method of claim 1, further comprising bonding the first contact pads to a board.

3. The method of claim 1, further comprising bonding the second contact pads to another semiconductor package.

4. The method of claim 3, wherein the semiconductor chip comprises a logic circuit, a power circuit or an optical circuit.

5. The method of claim 4, wherein the another semiconductor package comprises a memory chip.

6. The method of claim 3, wherein a spacing between the second main face of the semiconductor package and the another semiconductor package has a dimension that varies by more than eight micrometers across a lateral extension of the spacing.

7. The method of claim 3, wherein a main face of the another semiconductor package facing the semiconductor package has a warpage height of at least eight micrometers across a lateral extension of the main face.

8. The method of claim 3, wherein the second main face of the semiconductor package has a warpage height of at least eight micrometers across a lateral extension of the second main face.

9. The method of claim 1, wherein the exposed contact pad area of the second contact pads is defined by an opening in a solder mask layer overlying a metal layer forming the second contact pads.

10. The method of claim 1, wherein the exposed contact pad area of the second contact pads is defined by lateral dimensions of a metal layer forming the second contact pads.

11. The method of claim 1, wherein the diameter d in micrometers satisfies d≤(8/25)x+172 µm.

12. The method of claim 1, wherein the pitch is x=400 micrometers and the diameter is d≥260 micrometers.

13. The method of claim 1, wherein the pitch is x=500 micrometers and the diameter is d≥300 micrometers.

14. The method of claim 1, wherein the pitch is x=650 micrometers and the diameter is d≥340 micrometers.

15. The method of claim 1, further comprising:
an element having a conductive via, the conductive via extending from the first main face of the semiconductor package to a metal layer forming the second contact pads.

16. The method of claim 15, wherein the element is made of an insulating material.

17. A method of manufacturing a semiconductor package, the method comprising:
placing a plurality of semiconductor chips on a carrier;
covering the semiconductor chips with a molding material to form an encapsulant;
removing the carrier from the semiconductor chips;
forming a number of contact pads on a surface of the encapsulant facing away from the surface of the encapsulant which is defined by the carrier, a diameter d in micrometers of an exposed area of each contact pad satisfying d≥(8/25)x+142 µm, wherein x is a pitch of the contact pads in micrometers; and
singulating the semiconductor chips.

18. The method of claim 17, further comprising:
placing at least one element having a conductive via next to at least one of the semiconductor chips.

19. The method of claim 17, wherein the diameter d in micrometers satisfies d≤(8/25)x+172 µm.

20. The method of claim 17, wherein the pitch is x=400 micrometers and the diameter is d≥260 micrometers.

21. The method of claim 17, wherein the pitch is x=500 micrometers and the diameter is d≥300 micrometers.

22. The method of claim 17, wherein the pitch is x=650 micrometers and the diameter is d≥340 micrometers.

23. A method of manufacturing a package-on-package device, the method comprising:
providing a mounting platform;
placing a first semiconductor package comprising a first semiconductor chip, an encapsulant embedding the first semiconductor chip, first contact pads on a first main face of the first semiconductor package and second contact pads on a second main face of the first semiconductor package opposite to the first main face on the mounting platform;
placing a second semiconductor package comprising a second semiconductor chip, an encapsulant embedding the second semiconductor chip and third contact pads on a first main face of the second semiconductor package on the first semiconductor package, wherein the first main face of the second semiconductor package faces the second main face of the first semiconductor package; and
reflow soldering to electrically connect the second contact pads to the third contact pads and the first contact pads to the mounting platform,
wherein a diameter d in micrometers of an exposed contact pad area of the second contact pads satisfies d≥(8/25)x+142 µm, wherein x is a pitch of the second contact pads in micrometers.

24. The method of claim 23, wherein the semiconductor chip comprises a logic circuit, a power circuit or an optical circuit and wherein the second semiconductor package comprises a memory chip.

25. The method of claim 23, wherein a spacing between the second main face of the first semiconductor package and the first main face of the second semiconductor package has a dimension that varies by more than eight micrometers across a lateral extension of the spacing.

* * * * *